(12) United States Patent
Longworth et al.

(10) Patent No.: US 7,420,143 B2
(45) Date of Patent: Sep. 2, 2008

(54) DURABLE GRAPHITE CONNECTOR AND METHOD FOR MANUFACTURING THEREOF

(75) Inventors: Douglas Alan Longworth, Brecksville, OH (US); Timothy J. Heil, Independence, OH (US)

(73) Assignee: Momentive Performance Materials Inc., Wilton, CT (US)

( * ) Notice: Subject to any disclaimer, the term of this patent is extended or adjusted under 35 U.S.C. 154(b) by 203 days.

(21) Appl. No.: 11/549,101

(22) Filed: Oct. 12, 2006

(65) Prior Publication Data

US 2007/0284365 A1   Dec. 13, 2007

Related U.S. Application Data

(60) Provisional application No. 60/804,447, filed on Jun. 11, 2006.

(51) Int. Cl.
*H05B 3/16* (2006.01)
*C23C 16/00* (2006.01)

(52) U.S. Cl. .............. 219/543; 219/544; 219/444.1; 219/443.1; 219/540; 219/546; 219/548; 219/553; 392/407; 392/432; 118/725; 118/728; 338/248; 338/249

(58) Field of Classification Search ............. 219/542–4, 219/540, 443.1, 444.1, 449.1, 451.1, 468.1, 219/521, 546, 548, 552–3; 392/407, 432, 392/435; 118/725, 728; 338/248–9; 264/81
See application file for complete search history.

*Primary Examiner*—Shawntina Fuqua
(74) *Attorney, Agent, or Firm*—Dominick G. Vicari

(57) ABSTRACT

An article comprising a graphite part coated with a pyrolytic graphite (pG) for increased mechanical strength of at least 25% over an uncoated graphite part. In connector applications for use in a semiconductor processing assembly such as a heater, the pG coated component is overcoated with at least a protective layer of an electrically insulating material, and wherein part of the pG coated graphite part is exposed (uncoated with the protective layer) for providing electrical connections to the assembly.

22 Claims, 4 Drawing Sheets

FIG. 2A
FIG. 2B
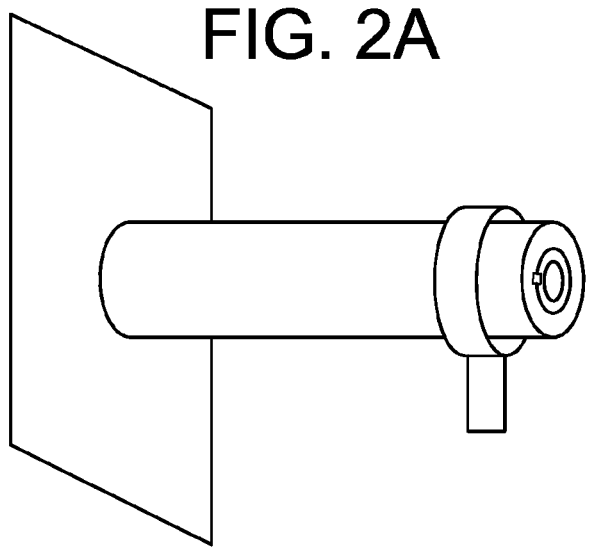
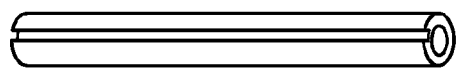
FIG. 3

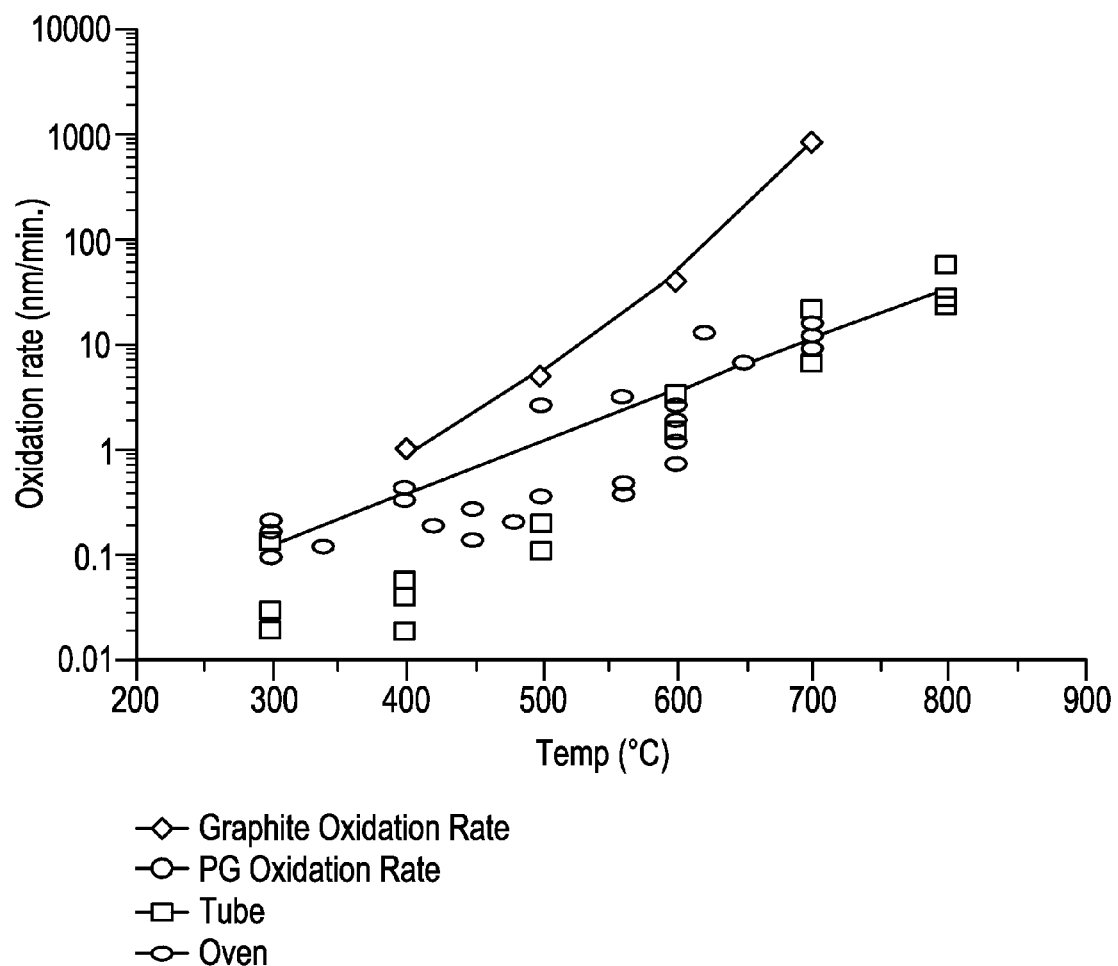

DURABLE GRAPHITE CONNECTOR AND METHOD FOR MANUFACTURING THEREOF

CROSS-REFERENCE TO RELATED APPLICATIONS

This application claims the benefits of U.S. application Ser. No. 60/804,447 filed Jun. 11, 2006, which patent application is fully incorporated herein by reference.

FIELD OF THE INVENTION

The invention relates to a hermetically sealed graphite part, and in one embodiment, to a coated graphite connector for extended useful life in a wafer processing apparatus.

BACKGROUND

Graphite is commonly used in high temperature applications such as semiconductor processing or metallurgical processes involving molten metals and alloys. Graphite has a melting point of 3550° C., which is the highest amongst the elements, thus with better heat resistance as compared with other materials. The material is readily machinable, possesses good electrical conductivity, provides excellent thermal shock resistance, and has high levels of refractoriness and strength at extremely high temperatures. Also, graphite components are less expensive than similarly sized metallic or ceramic components.

Graphite is frequently used as connection posts for heaters, for holding wafer substrates in a plasma chamber. U.S. Pat. No. 5,343,022 discloses such an application, wherein graphite posts are used to connect the heating element of the heater to an external powder supply. U.S. Patent Publication No. 2004173161 discloses a wafer support assembly with a graphite concentric post (either solid or hollow) for connecting the heater to an external power supply. U.S. Pat. No. 5,233,163 discloses a heater having a columnar body and a pair of graphite "legs" or connection posts.

In one embodiment of the prior art as disclosed in U.S. Pat. No. 5,343,022 and U.S. Patent Publication No. 2004173161, the graphite posts are coated with at least a protective layer, e.g., boron nitride, aluminium nitride, and the like, protecting the graphite from the reactive environment. However, certain parts of the graphite posts must be exposed so that electrical connection can be made to the graphite post and hence the heater. The coating layer provides protection to graphite parts in corrosive environment. However, graphite that is suitable for accepting coating typically has poor mechanical strength, with tensile and flexural strength ranging from 1-4 ksi. The typical values of tensile and flexural strength of metals used for such connections, e.g., tantalum and molybdenum, are 100 ksi. The poor mechanical strength of graphite can lead to cracking or breaking of the graphite part, i.e., the graphite post, when a load or stress is applied. This can be during the connection of the graphite post to the external power supply, during thermal cycling, during installation into the process tool, and sometimes even during shipping. The failure part is quite often than not, initiated in the area that is not encapsulated with a protective coating layer. Coated graphite sections have quite often failed in operation as well, although not as frequent as with the uncoated part. Either failure mode, in the coated section or uncoated section of the graphite part, will render the heating unit non-functional.

There is a need for to extend the life of and strengthen graphite parts, particularly as connection posts for heaters, without compromising the inherent properties of graphite such as excellent electrical conductivity and thermal shock resistance.

SUMMARY OF THE INVENTION

The invention relates to a graphite article having a coating layer comprising pyrolytic graphite (pG) with an average thickness of 0.001" to 0.10", wherein the graphite article has a tensile strength of at least 25% higher than a corresponding graphite article without the pG coating layer. In one embodiment, the graphite part is further provided with at least a protective coating layer comprising at least one of a nitride, carbide, carbonitride or oxynitride of elements selected from a group consisting of B, Al, Si, Ga, refractory hard metals, transition metals, and combinations thereof.

In one embodiment, the invention relates to a graphite connector for use in supporting a wafer substrate holder in a heater assembly and providing electrical connection to heating elements in the heater. The graphite connector is further coated with at least a layer of pyrolytic graphite (pG) and an overcoat protective layer comprising at least a layer of pBN or AlN. At least one end of the pG coated graphite connector is exposed (not coated with either pBN and/or AlN) to connect the heating elements to an external power supply.

In one aspect, the invention relates to an article comprising a graphite part coated with a pyrolytic graphite (pG) for increased mechanical strength of at least 50% over an uncoated graphite part. In connector applications for use in a semiconductor processing assembly such as a heater, the pG coated component is overcoated with at least a protective layer of an electrically insulating material, and wherein part of the pG coated graphite part is exposed (uncoated with the protective layer) for providing electrical connections to the assembly.

The invention further relates to a method to increase the tensile strength, and subsequently, the service life of a graphite part in a high temperature environment, by providing the graphite part with a coating layer of pyrolytic graphite having an average thickness of 0.001" to 0.10". In one embodiment, the pG coated graphite part is further provided with an overcoat protecting layer comprising at least a nitride, carbide, carbonitride or oxynitride of elements selected from a group consisting of B, Al, Si, Ga, refractory hard metals, transition metals, and combinations thereof. At least a portion of the pG coated graphite part is exposed (uncoated) in one embodiment for the graphite part to function as an electrical conductor.

BRIEF DESCRIPTION OF THE DRAWINGS

FIG. 2A is a perspective view of another embodiment of a graphite connector having a hollow core. FIG. 2B is a perspective view of a core member that is used for insertion into the hollow core of the graphite connector of FIG. 2A.

FIG. 3 is a diagram illustrating the stress status in a solid graphite connector.

FIG. 6 is a graph comparing the oxidation rate of a coated graphite connector vs. an uncoated part at elevated temperatures.

DESCRIPTION OF THE INVENTION

Figure 1A:
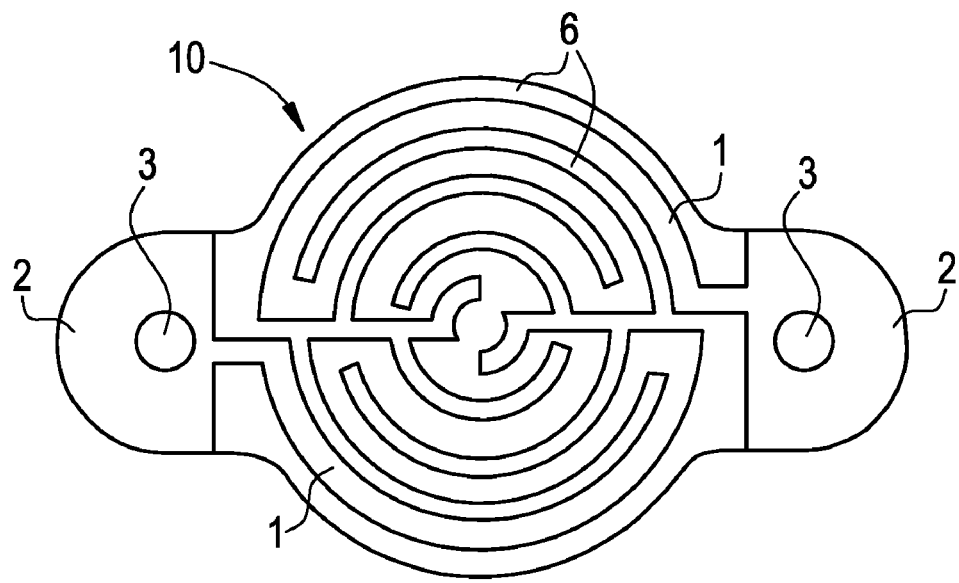
FIG. 1A is a top view of a heater employing the durable/reinforced graphite connector of the invention, for a heater with a dual-post assembly.

As used herein, the terms "first," "second," and the like do not denote any order or importance, but rather are used to distinguish one element from another, and the terms "the", "a" and "an" do not denote a limitation of quantity, but rather denote the presence of at least one of the referenced item. All ranges disclosed herein are inclusive and combinable. Furthermore, all ranges disclosed herein are inclusive of the endpoints and are independently combinable. Also, as used in the specification and in the claims, the term "comprising" may include the embodiments "consisting of" and "consisting essentially of."

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

Also as used herein, the term "wafer handling apparatus" may be used interchangeable with "heater," "chuck," "electrostatic chuck," "ESC," and "susceptors" in the singular or plural form, referring to a device to support a wafer, a substrate, or another type of workpiece during the manufacture of semiconductor devices. In one embodiment of a wafer handling apparatus, a wafer is secured to the chucking surface by the electrostatic force generated between an external electrode and an electrode embedded in the wafer handling apparatus. ESC can be of the Columbic type or of Johnson-Rahbek type.

As used herein, "protective coating" layer may be used interchangeably with "protective film coating layer," "coating layer," or "coating film," or "protective layer," or "protective coating layer," used in singular or plural form, indicating the presence of at least one layer or a plurality of layers for coating the part.

As used herein, the term "connection assembly" may be used interchangeably with "connector assembly," or simply "connector," a graphite part for use in connecting two different parts or structures, and wherein there is a need for electrical connectivity between the two parts. The graphite part can be an integral part with one of the two parts or structure, e.g., for a heater assembly, or the graphite part can be a post or a connector integral with the heater body, for connecting the heater assembly to an external power supply.

The invention relates to an improved method to strengthen a graphite part while still maintaining the excellent electrical conductivity and thermal shock resistance properties of graphite. As the tensile and flexural strength of pyrolytic graphite is approximately 10 times that of graphite (in the range of 12-20 ksi as compared to 1-4 ksi for graphite), by adding a thin coating of pyrolytic graphite to a graphite component, the composite strength of the part is increased while still maintaining the electrically conductivity characteristic of the graphite part.

Coated Graphite Connector: In one embodiment, at least part of the graphite part is coated with a pyrolytic graphite ("PG") coating layer to add structural integrity to the graphite post. The pG coating layer is applied at a sufficient thickness to give the graphite part an increase in tensile strength of at least 25% over an uncoated part. In one embodiment, the coating layer is applied at a sufficient thickness for the coated graphite part to have an increase in tensile strength of at least 50% over an uncoated graphite part. In yet another embodiment, the coated graphite part shows a tensile strength increase of at least 70%. In one embodiment, the pG coating layer has an average thickness ranging from 0.001" to 0.10" (0.00254 to 0.254 cm). In a second embodiment, the PG coating layer has a thickness ranging from 0.005" to 0.05" (0.0127 to 0.127 cm). In a third embodiment, the coating layer has a thickness of at least 0.0254". In a fourth embodiment, the coating layer has a thickness of less than 0.05" (0.0254 cm).

When the graphite part of the invention is used as connectors or posts in wafer support assemblies in semiconductor processing applications, e.g., heaters, there is another added advantage. In these applications, most of the graphite part (except for the exposed end of a connector for electrical connection to a power supply) is coated with a protective electrically insulation material such as pBN, AlN, and the like. In the "enforced" graphite part, where the graphite portion is coated with a pG layer, the pG tends to fill up the pores in graphite (with a typical volume porosity of 10%-20% in one example), thus further enhancing the composite strength of the graphite part.

There is yet another advantage of a graphite part enforced by a pG coating. Depending on the graphite used, graphite typically has a coefficient of thermal expansion (CTE) in the range of 1.2 to $8.2 \times 10^{-6}$/K. Pyrolytic graphite has a CTE of $0.5 \times 10^{-6}$/K for the a-b direction and $20 \times 10^{-6}$/K for the c direction. Pyrolytic boron nitride has a CTE of $2 \times 10^{-6}$/K in the ab-direction and $40 \times 10^{-6}$/K in the c-direction of. In one embodiment of an enforced graphite connector for a heater coated with pBN (except for the exposed / uncoated electrical connection parts), as the overcoat pG layer has a CTE that closely matches that of the adjacent pBN layer, there is a better adhesion between pBN and pG, and thus mitigating the delamination or cracking defects in the heater body as a whole.

The pG coating layer further protects the underlying graphite part in slowing down the etch rate on graphite in an oxidizing environment. Graphite is known to be susceptible to oxidation, beginning at comparatively low temperatures and becoming progressively more severe with increasing temperature, and as measured by the change in the graphite part. In one embodiment, the graphite part is coated with a sufficiently thick layer of pG for the enforced graphite part to have an oxidation rate (as converted from weight loss to thickness loss off the surface) of less than 10 nm/min. at a temperature of at least 800° C. In a second embodiment, the pG coated part has an oxidation rate of less than 5 nm/min. at a temperature of at least 600° C. In a third embodiment, the pG coated part has an oxidation rate of less than 2 nm/min. at a temperature of at least 500° C.

It should be noted that in embodiments for enforced graphite connectors for use as heater connectors, the protective coating layer is not limited to pBN. The protective coating layer can be selected from any of nitride, carbide, carbonitride or oxynitride of elements selected from a group consisting of B, Al, Si, Ga, refractory hard metals, transition metals, and combinations thereof. In one embodiment, the coating layer has a CTE ranging from $2.0 \times 10^{-6}$/K to $10 \times 10^{-6}$/K in a temperature range of 25 to 100° C. In one embodiment, the coating has a thickness of greater than or equal to about 2 micrometers (μm) and less than 500 μm. In another embodiment, the protective coating thickness is greater than or equal to about 10 μm. In a third embodiment, the thickness is greater than or equal to about 50 μm. In yet another embodiment, the thickness is greater than or equal to about 75 μm. In a fourth embodiment, the thickness ranges from 5 to 300 μm.

In one embodiment, the protective coating layer is one of pyrolytic boron nitride, aluminum nitride (AlN), aluminum oxide, aluminum oxynitride, silicon nitride, or complexes thereof. In another embodiment, the coating layer is a multi-layer of multiple coatings of the same material, e.g., AN, AlON, Al$_2$O$_3$, etc., or multiple different layers of AlN, AlON, pBN, SiN, etc., coated in succession. In yet another embodiment, the graphite part is first coated with pG, followed by a coating of pBN, another layer of pG coating, to be subsequently followed by an AlN coating, coated in succession.

In one embodiment for a graphite connector in the form of a post or a tube (with a hollow or partially hollow center), the connector is further enforced by also coating the outside and/or inside surface of the hollow connector with the pyrolytic graphite coating layer. In yet another embodiment of a hollow graphite connector or post as illustrated in FIG. 2A, structural integrity of the graphite connector is further strengthened by inserting a core member such as a metal rod into the hollow core.

In one embodiment, the core member is a solid rod with a size sufficient for the rod to be inserted all the way into the hollow center of the graphite connector. In a second embodiment, the core member is inserted part way into the connector. In a third embodiment, the core member is in the form of a cylindrical tube as illustrated in FIG. 2B, with a full-length (or part-length) slit along its length, thus allowing the core member to easily slide into the hollow core of the connector and/or relieving the thermal mismatch stress between different parts.

In one embodiment with a hollow core member to provide sufficient structural strength to a graphite connector, the support core member further provides added benefits in terms of reducing heat transfer down the post. As illustrated in the diagram of FIG. 3 of a stress model, at the fixed end of a rod (solid core) connector and near the center axis of the rod connector, the stress is almost zero. As shown, as the stress increases linearly along the radius of the rod, the stress is more concentrated around the perimeter of the cross section. Therefore, going from a solid connector (such as a rod) to a hollow connector (such as a tube) does not significantly reduce the strength of the rod. However, as the heat conduction is proportional with the cross section area, going from a solid connector to a hollow connector will reduce the heat conduction significantly, thus further lowering the temperature of the end of the connector.

Methods for Forming: Pyrolytic graphite ("PG") can be formed on the graphite part by conducting a pyrolytic reaction of a gaseous hydrocarbon compound so as to deposit the pyrolytic graphite on the surface of the graphite connector. The protective coatings layer, e.g., pG and other coating materials, may be deposited on a graphite part by any of the processes known in the art, e.g., expanding thermal plasma (ETP), ion plating, ion plasma deposition (or cathodic arc deposition), chemical vapor deposition (CVD), plasma enhanced chemical vapor deposition (PECVD), metal organic chemical vapor deposition (MOCVD) (also called Organometallic Chemical Vapor Deposition (OMCVD)), metal organic vapor phase epitaxy (MOVPE), physical vapor deposition processes such as sputtering, reactive electron beam (e-beam) deposition, and plasma spray. Exemplary processes are ETP, CVD, and ion plating.

The graphite part configuration includes, but is not limited to, a graphite rod, a hollow graphite rod, a stump, a lead, a thread nut, and the like. The pG coated/enforced graphite part of the invention with increased strength and extended service life can also be used in applications other than graphite connectors/posts in semi-conductor processing. In one embodiment, the pG coated/enforced graphite part is used for at least a part of an upper portion of an electrode in a heater mechanism for a crystal pulling apparatus, which is projected into a furnace when a heater is raised.

Other examples for the graphite part of the invention include but are not limited to element supports, support bars, and fixture for furnace (CVD) applications; general hardware assemblies such as plates, nuts, rods, spacers, bolts, sleeves, discs, tubes, washers, studs; general kinetic hardware applications including gears, rollers, shafts, slide plates, lift off arms, bearings, pusher bars, stopper rods, and the like; and general heater hardware such as connectors (as illustrated in the Figures), power lead-ins, slats, and heating elements. Depending on the applications as whether protection from demanding/corrosive environment is needed, the part can be further coated with at least an electrically insulating layer such as pBN, AlN, etc. When electrical connection is needed, at least some of the pG coating layer is exposed to allow connection with a power supply.

Various embodiments of the enforced graphite connector of the invention are illustrated as follows, by way of references to the figures for use in an exemplary application of heater assemblies in the semiconductor processing industry.

In one embodiment, the enforced graphite parts are used in a heater 10 with dual graphite posts as illustrated in FIG. 1A, which is a top view of the heater showing a coated graphite body 10 of substantially circular cross section and two tabs 2 extending from the body 10. The graphite body 10 (except for the heating patterns or grooves 16) is entirely coated with at least a protective layer 9 (not shown). Heating element 1 exposes the graphite under the coating layer to form an electrical circuit through groves 6. Holes 3 are drilled through the tabs 2 for attaching the graphite connectors or post 11 to the coated graphite body 10.

Figure 1B:
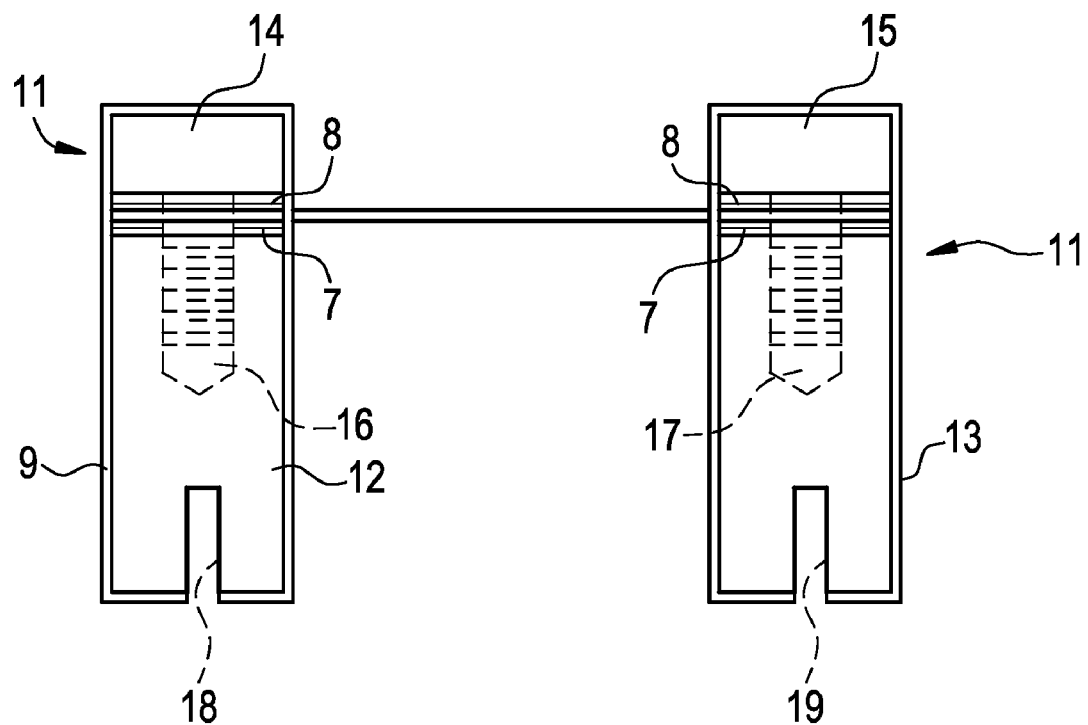
FIG. 1B is a cross-section view of the heater of FIG. 1A.

In FIG. 1B, the post connectors include graphite posts 12 and 13 and graphite screws 14 and 15. The graphite posts have threaded holes 16 and 17 at one end to receive the screws 14 and 15 for connecting with the coated graphite body of FIG. 1A. At the other end of the posts, exposed sections 18 and 19 are for attachment to an external power supply (not shown). A pair of flexible graphite washers 7 and 8 are used with each post connector 11 to provide a solid physical and electrical attachment between each post connector 11 and the heating element 1. The graphite post 11 are coated with at least a protective layer 9, with the exception of the tapped hole 18 (on the left), or the ring 19 (on the right), which are left unprotected for attachment to the external powder supply. The protective layer 9 comprises a material such a nitride, carbide, carbonitride or oxynitride of elements selected from a group consisting of B, Al, Si, Ga, refractory hard metals, transition metals, and combinations thereof. In one embodiment, it is pyrolytic boron nitride. In a second embodiment, it is aluminum nitride.

Figure 4:
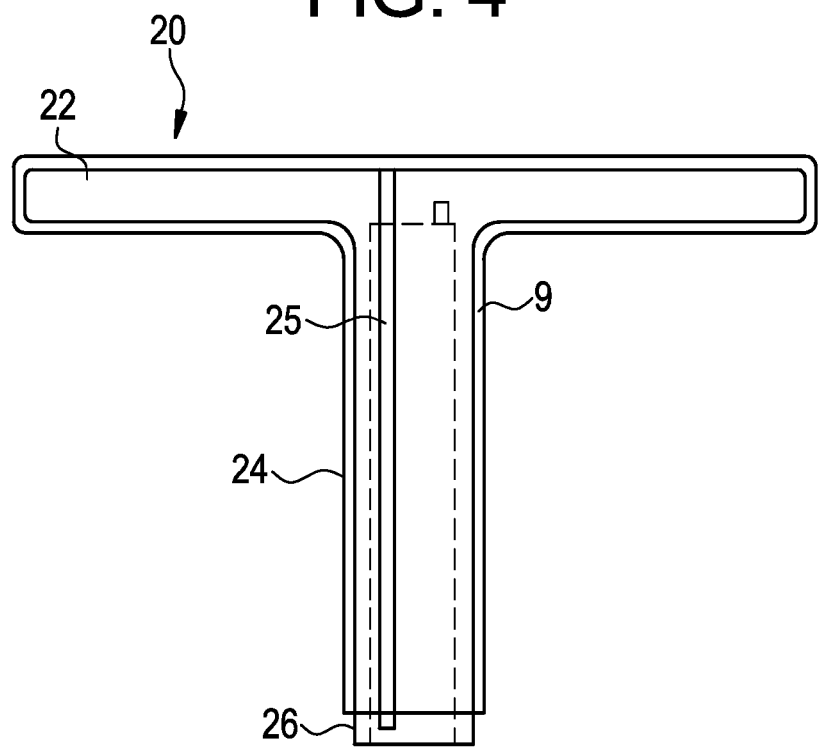
FIG. 4 is a cross section view of another embodiment of a heater employing the reinforced graphite connector of the invention, in the form of a unitary or "mushroom" heater assembly.

In yet another embodiment, the enforced graphite connector is in the form of a shaft for use in a unitary assembly of a "mushroom" wafer heating assembly as illustrated in FIG. 4. In the figure, the apparatus 20 comprises a platform 22 and a mounting structure 24 in the form of a shaft extending from the platform 22, and substantially transverse to the longitudinal axis of the platform 22. The external surface of the apparatus is coated with at least a protective layer 9 except for the very end 26 of shaft 24, which uncoated end is for connecting to an external power supply. The shaft 24 can be machined from a solid body of graphite to form a hollow graphite core, to be later mechanically attached to the graphite platform. In another embodiment, the shaft is manufactured in unison with the formation of the graphite platform 22 such that the shaft 24 and platform 22 define a single unitary graphite body. Electrical conductors 25 are connected at the end to an external power source through the exposed end 26 (not coated by a protective layer).

Figure 5:
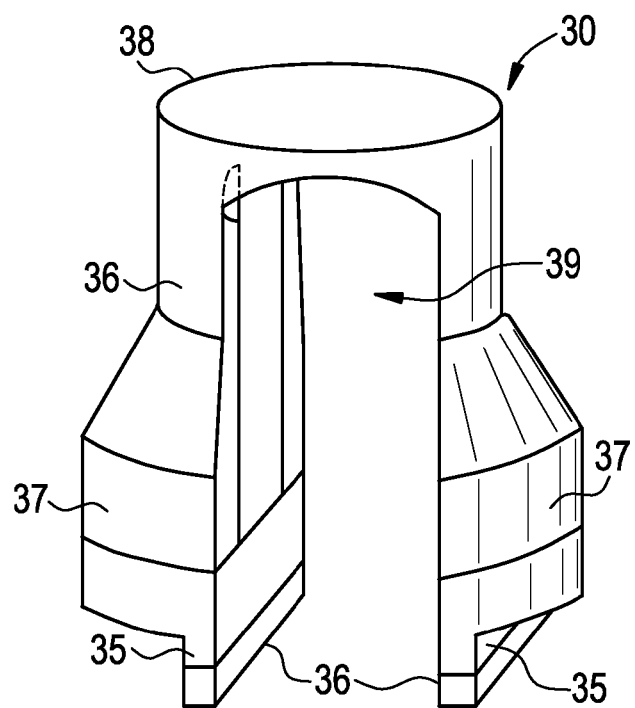
FIG. 5 is a perspective view of another embodiment of a heater employing the reinforced graphite connector of the invention.

FIG. 5 illustrates yet another embodiment of a graphite connector in a column form. In the figure, a wafer support assembly 30 comprises a cylindrical graphite body having a flat surface 38 forming the wafer holding substrate. An opening 39 is formed in the lower part of the body for a pair of approximately parallel columns 37 and parallel legs or connectors 35. A plurality of grooves (not shown) are formed on columns 37 for a heater pattern. The heating element is connected to an external heater supply via the leg connectors 35. The entire cylindrical body, including the columns 37, legs 35 but excluding the exposed pyrolytic graphite coated ends 36 of the legs, is coated with at least a protective coating layer (not shown).

EXAMPLE

Examples are provided herein to illustrate the invention but are not intended to limit the scope of the invention.

Example 1

A pyrolytic heating unit as disclosed in U.S. Pat. No. 5,343, 022 was used for the test with graphite posts having a dimension of $\frac{3}{8}$" diameter used as the graphite connector. However, the entire graphite posts were first coated with a graphite layer of a thickness of 0.005" prior to being assembled in the heater assembly. Because the end of the graphite posts was to be exposed for electrical connections, the end (about ½" in length) was masked in the next step for an additional pBN coating. It should be noted that the exposed graphite ends could have been obtained by subjecting the entire post to pBN coating, then for the pBN to be subsequently mechanically removed or etched.

Example 1 was repeated, however, the graphite posts were constructed as described in U.S. Pat. No. 5,343,022 and without any pG reinforcement coating layer.

A 3-point bend test was conducted on the graphite posts. Test results indicated that the pG coated graphite posts had a tensile strength increase of 70% over the graphite posts without the pG coating of the comparative example. This translates to a corresponding increase in service life.

Example 2 pG coated graphite posts of Example 1 (but without the additional pBN coating) and uncoated graphite posts (without any pG nor additional pBN coating) were heated to elevated temperatures in an oven and a tube furnace respectively. The change in weight of the parts was recorded to determine the change in weight brought about by oxidation in the oven or tube furnace. The results of the experiments are as illustrated in FIG. 6, with the oxidation rate being converted from weight loss to thickness loss in nanometer per minute.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A graphite article for use in an assembly for a semiconductor processing environment, comprising
   a graphite core,
   a coating layer comprising pyrolytic graphite having an average thickness of 0.001" to 0.10",
   a protective coating layer disposed on a least a portion of the pyrolytic graphite coating layer, the protective coating layer comprising at least one of a nitride, carbide, carbonitride or oxynitride of elements selected from a group consisting of B, Al, Si, Ga, refractory hard metals, transition metals, and combinations thereof; and
   wherein the graphite article has a tensile strength of at least 25% higher than a corresponding graphite article without the pyrolytic graphite coating layer and the protective coating layer.

2. The graphite article of claim 1, wherein the graphite article has a tensile strength of at least 50% higher than a corresponding graphite article without the pyrolytic graphite coating layer and the protective coating layer.

3. The graphite article of claim 1, wherein the graphite article has a tensile strength of at least 70% higher than a corresponding graphite article without the pyrolytic graphite coating layer and the protective coating layer.

4. The graphite article of claim 1, wherein the pyrolytic graphite coating layer has a thickness of 0.005" to 0.05".

5. The graphite article of claim 1, wherein the pyrolytic graphite coating layer has a thickness of 0.0254" to 0.05".

6. The graphite article of claim 1, for use as one of an element support, a support bar, a fixture, a plate, a nut, a rod, a spacer, a bolt, a sleeve, a disc, a tube, a washer, a stud, a gear, a roller, a shaft, a slide plate, a lift off arm, a bearing, a pusher bar, a stopper rod, a connector, a power lead-in, and a slat.

7. The graphite article of claim 1, wherein the graphite core is hollow having a surface, and wherein at least a portion of the surface on hollow core is coated by at least a layer of a pyrolytic graphite coating layer having an average thickness of 0.001" to 0.10".

8. The graphite article of claim 1, wherein the pyrolytic graphite coating layer is further coated by a protective coating layer comprising at least one of a nitride, carbide, carbonitride or oxynitride of elements selected from a group consisting of B, Al, Si, Ga, refractory hard metals, transition metals, and combinations thereof.

9. The graphite article of claim 1, wherein the graphite core is hollow, and wherein the graphite article further comprises:
   a support member disposed within the hollow core.

10. The graphite article of claim 8, wherein the support member is a tube comprising metal.

11. The graphite article of claim 1, for use in a wafer processing apparatus in a chemical vapor deposition furnace, and wherein the graphite article has an oxidation rate of less than 10 nm/min. at a temperature of at least 600° C.

12. The graphite article of claim 1, wherein the article has an oxidation rate of less than 5 nm/min. at a temperature of at least 600° C.

13. The graphite article of claim 1, wherein the article has an oxidation rate of less than 2 nm/min. at a temperature of at least 500° C.

14. The graphite article of claim 1, wherein the protective coating layer comprises one of pyrolytic boron nitride and aluminum nitride.

15. The graphite article of claim 1, wherein the protective coating layer has a CTE ranging from $2.0 \times 10^{-6}$/K to $10 \times 10^{-6}$/K in a temperature range of 25 to 1000° C.

16. The graphite article of claim 1, wherein at least a portion of the pyrolytic graphite coating layer is exposed and not coated with the protective coating layer, for providing electrical connection with an external power source.

17. The graphite article of claim 1, in the form of a shaft providing support to a wafer-processing device, wherein:
the shaft has a connection end for connecting with an external power supply to provide electrical connection to the wafer processing device and a base end for providing support for a substrate to support a wafer to be processed;
the shaft is coated with a pyrolytic graphite layer having an average thickness of 0.001" to 0.10", having an outer protective layer of a thickness of 2-500 μm comprising least a nitride, carbide, carbonitride or oxynitride of elements selected from a group consisting of B, Al, Si, Ga, refractory hard metals, transition metals, and combinations thereof, the protective layer has a CTE ranging from $2.0 \times 10^{-6}$/K to $10 \times 10^{-6}$/K in a temperature range of 25 to 1000° C. at least a portion of the connection end of the shaft is not coated with the protective layer, for the pG coating layer to be exposed for connecting the wafer-processing device with the external power supply.

18. A wafer processing assembly for heating a wafer substrate, the assembly comprises:
an electric heater comprising a graphite substrate having a flat surface for supporting the wafer substrate and at least a support shaft for supporting the flat surface, the support shaft comprises a graphite connector for connecting the electric heater to a power supply means, the graphite connector is coated with at least a layer of pyrolytic graphite having a thickness of 0.001" to 0.10", and wherein the graphite connector has a tensile strength of at least 25% higher than a corresponding graphite article without the pG coating layer.

19. The wafer processing assembly of claim 18, wherein the pG coated graphite connector is further coated with at least a protective coating layer on a least a portion of the graphite coating layer, the protective coating layer comprising at least one of a nitride, carbide, carbonitride or oxynitride of elements selected from a group consisting of B, Al, Si, Ga, refractory hard metals, transition metals, and combinations thereof.

20. The wafer processing assembly of claim 18, wherein the support shaft further comprising a support member disposed within the shaft, and wherein the support member is a tube comprising metal.

21. A heater assembly for use in semi-conductor processing applications, the assembly comprises:
a heater which is vertically moved in a furnace;
an electrode connected to the heater, the electrode comprises a graphite part which is coated with at least a layer of pyrolytic graphite having a thickness of 0.001" to 0.01", and wherein the graphite part has a tensile strength of at least 25% higher than a corresponding graphite part without the pG coating layer.

22. A method for extending the service life of a graphite part in assemblies for use in semi-conductor processing applications, the method comprises:
coating the graphite part with at least a layer of pyrolytic graphite (pG) having a thickness of 0.001" to 0.10";
coating at least part of the pG coated graphite with a layer having a thickness of 2-500 μm and comprising least a nitride, carbide, carbonitride or oxynitride of elements selected from a group consisting of B, Al, Si, Ga, refractory hard metals, transition metals, and combinations thereof, for the graphite part to have a tensile strength of at least 25% higher than a corresponding graphite article without the pG coating layer and the outer protective layer.

* * * * *